(12) United States Patent
Thomas et al.

(10) Patent No.: US 12,249,450 B2
(45) Date of Patent: Mar. 11, 2025

(54) PERPENDICULARLY MAGNETIZED FERROMAGNETIC LAYERS HAVING AN OXIDE INTERFACE ALLOWING FOR IMPROVED CONTROL OF OXIDATION

(71) Applicant: Taiwan Semiconductor Manufacturing Company, Ltd., Hsinchu (TW)

(72) Inventors: Luc Thomas, San Jose, CA (US); Guenole Jan, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1507 days.

(21) Appl. No.: 16/679,472

(22) Filed: Nov. 11, 2019

(65) Prior Publication Data

US 2020/0075213 A1    Mar. 5, 2020

Related U.S. Application Data

(62) Division of application No. 15/196,807, filed on Jun. 29, 2016, now Pat. No. 10,475,564.

(51) Int. Cl.
| H10N 35/01 | (2023.01) |
| B24B 37/20 | (2012.01) |
| G03F 7/16 | (2006.01) |
| G11C 11/16 | (2006.01) |
| H01F 10/12 | (2006.01) |
| H01F 41/30 | (2006.01) |
| H10N 50/01 | (2023.01) |
| H10N 50/10 | (2023.01) |
| H10N 50/85 | (2023.01) |

(52) U.S. Cl.
CPC .......... *H01F 10/123* (2013.01); *B24B 37/20* (2013.01); *G03F 7/16* (2013.01); *G11C 11/161* (2013.01); *H01F 41/307* (2013.01); *H10N 35/01* (2023.02); *H10N 50/01* (2023.02); *H10N 50/10* (2023.02); *H10N 50/85* (2023.02)

(58) Field of Classification Search
CPC .......... G03F 7/16; H10N 50/10; H10N 35/01
See application file for complete search history.

(56) References Cited

U.S. PATENT DOCUMENTS

| 8,456,898 B2 | 6/2013 | Chen et al. |
| 8,592,927 B2 | 11/2013 | Jan et al. |
| 9,007,725 B1 | 4/2015 | Diao et al. |
| 9,025,371 B1 | 5/2015 | Huai et al. |
| 9,029,965 B2 | 5/2015 | Chen et al. |
| 9,780,299 B2 | 10/2017 | Zhu et al. |
| 10,193,062 B2 | 1/2019 | Iwata et al. |
| 2002/0085323 A1* | 7/2002 | Smith ................. G11B 5/3909 |
| 2008/0151615 A1 | 6/2008 | Rodmacq et al. |
| 2008/0191295 A1* | 8/2008 | Ranjan ................. H10B 61/22 257/E27.005 |
| 2009/0059656 A1* | 3/2009 | Kanakasabapathy .. H10B 61/00 365/158 |
| 2012/0280336 A1 | 11/2012 | Jan et al. |
| 2013/0175644 A1 | 7/2013 | Horng et al. |
| 2013/0221460 A1 | 8/2013 | Jan et al. |
| 2013/0270523 A1 | 10/2013 | Wang et al. |
| 2014/0035074 A1 | 2/2014 | Jan et al. |
| 2014/0210025 A1 | 7/2014 | Guo |
| 2017/0117459 A1 | 4/2017 | Watanabe et al. |
| 2017/0263857 A1 | 9/2017 | Watanabe et al. |
| 2017/0294575 A1 | 10/2017 | Hu et al. |
| 2018/0005746 A1 | 1/2018 | Thomas et al. |

FOREIGN PATENT DOCUMENTS

| JP | 2008124486 A | 5/2008 |
| JP | 2008283207 A | 11/2008 |
| JP | 2013115401 A | 6/2013 |
| JP | 201561056 A | 3/2015 |
| KR | 20160004905 A | 1/2016 |
| WO | 2012151098 A1 | 8/2012 |
| WO | WO2015136969 | 9/2015 |

OTHER PUBLICATIONS

Communication pursuant to Article 94(3) EPC dated Aug. 12, 2019, Application No. 17178039.8, 5 pages.
European Search Report, Application No. 17178039.8-1556, Applicant: Headway Technologies Inc., dated Nov. 23, 2017, 8 pages.
Office Action dated Oct. 20, 2021, issued by the Korean Intellectual Property Office in Korean Patent Application No. 10-2017-0082887, cover sheet and 6 pages.

* cited by examiner

*Primary Examiner* — Daborah Chacko-Davis
(74) *Attorney, Agent, or Firm* — Haynes and Boone, LLP

(57) ABSTRACT

An improved magnetic tunnel junction with two oxide interfaces on each side of a ferromagnetic layer (FML) leads to higher PMA in the FML. The novel stack structure allows improved control during oxidation of the top oxide layer. This is achieved by the use of a FML with a multiplicity of ferromagnetic sub-layers deposited in alternating sequence with one or more non-magnetic layers. The use of non-magnetic layers each with a thickness of 0.5 to 10 Angstroms and with a high resputtering rate provides a smoother FML top surface, inhibits crystallization of the FML sub-layers, and reacts with oxygen to prevent detrimental oxidation of the adjoining ferromagnetic sub-layers. The FML can function as a free or reference layer in an MTJ. In an alternative embodiment, the non-magnetic material such as Mg, Al, Si, Ca, Sr, Ba, and B is embedded by co-deposition or doped in the FML layer.

20 Claims, 13 Drawing Sheets

| Top Electrode | 50 |
| --- | --- |
| Hard Mask | 45 |
| Capping Layer | 40 |
| Free Layer (FL) | 20 |
| Tunnel Barrier | 19 |
| Reference Layer (RL) | 10 |
| Seed Layer | 2 |
| Substrate/Electrode | 1 |

FIG. 1

| Top Electrode | 50 |
| --- | --- |
| Hard Mask | 45 |
| Capping Layer | 40 |
| Reference Layer (RL) | 10 |
| Tunnel Barrier | 19 |
| Free Layer (FL) | 20 |
| Seed Layer | 2 |
| Bottom Substrate | 1 |

FIG. 2

| Capping Layer | 40 | |
| --- | --- | --- |
| $FML_2$ | 20c | |
| $NML_1$ | 20b | 20-1 |
| $FML_1$ | 20a | |
| Tunnel Barrier | 19 | |

FIG. 3a

| Top Electrode/Hard Mask | — 50 |
| --- | --- |
| Non-Magnetic Metal Cap Layer | — 40b |
| Free Layer (FL) | — 20-1, 20-2, or 20-3 |
| Oxide Tunnel Barrier | — 19 |
| Reference Layer (RL) | — 11 |
| Seed Layer | — 2 |
| Substrate/Bottom Electrode | — 1 |

FIG. 7

| Top Electrode/Hard Mask | — 50 |
| --- | --- |
| Non-Magnetic Metal Cap Layer | — 40b |
| Reference Layer (RL) | — 11 |
| Oxide Tunnel Barrier | — 19 |
| Free Layer (FL) | — 20-1, 20-2, or 20-3 |
| Seed Layer | — 2 |
| Substrate/Bottom Electrode | — 1 |

FIG. 8

| Top Electrode/Hard Mask | — 50 |
| --- | --- |
| Non-Magnetic Metal Cap Layer | — 40b |
| Reference Layer (RL) | — 11 |
| Oxide Tunnel Barrier | — 19 |
| Free Layer (FL) | — 20-1, 20-2, or 20-3 |
| Oxide Layer | — 15 |
| Seed Layer (Optional) | — 2 |
| Substrate/Bottom Electrode | — 1 |

FIG. 9

| Top Electrode/Hard Mask | — 50 |
|---|---|
| Oxide Cap Layer | — 40a |
| Reference Layer (RL) | — 10-1, 10-2, or 10-3 |
| Oxide Tunnel Barrier | — 19 |
| Free Layer (FL) | — 21 |
| Seed Layer (Optional) | — 2 |
| Substrate/Bottom Electrode | — 1 |

FIG. 10

| Top Electrode/Hard Mask | — 50 |
|---|---|
| Non-Magnetic Metal Cap Layer | — 40b |
| Reference Layer (RL) | — 10-1, 10-2, or 10-3 |
| Oxide Tunnel Barrier | — 19 |
| Free Layer (FL) | — 21 |
| Seed Layer (Optional) | — 2 |
| Substrate/Bottom Electrode | — 1 |

FIG. 11

| Top Electrode/Hard Mask | — 50 |
|---|---|
| Non-Magnetic Metal Cap Layer | — 40b |
| Free Layer (FL) | — 21 |
| Oxide Tunnel Barrier | — 19 |
| Reference Layer (RL) | — 10-1, 10-2, or 10-3 |
| Non-Magnetic Metal Seed Layer | — 2 |
| Substrate/Bottom Electrode | — 1 |

FIG. 12

| Top Electrode/Hard Mask | 50 |
|---|---|
| Non-Magnetic Metal Cap Layer | 40b |
| Free Layer (FL) | 21 |
| Oxide Tunnel Barrier | 19 |
| Reference Layer (RL) | 10-1, 10-2, or 10-3 |
| Oxide Layer | 15 |
| Substrate/Bottom Electrode | 1 |

FIG. 13

| Top Electrode | 50 |
|---|---|
| Cap Layer | 40 |
| Free Layer | 22 |
| Oxide Layer (Tunnel Barrier) | 19 |
| Reference Layer | 11 |
| Seed Layer (Optional) | 2 |
| Substrate | 1 |

FIG. 14

| Top Electrode | 50 |
|---|---|
| Non-Magnetic Metal Cap Layer | 40b |
| Reference Layer | 11 |
| Oxide Layer (Tunnel Barrier) | 19 |
| Free Layer | 22 |
| Oxide Layer | 15 |
| Substrate | 1 |

FIG. 15

| Top Electrode | 50 |
| Cap Layer | 40 |
| Reference Layer | 12 | doped with Mg, Al, Si, Ca, Sr, Ba, or B
| Oxide Layer (Tunnel Barrier) | 19 |
| Free Layer | 21 |
| Seed Layer (Optional) | 2 |
| Substrate | 1 |

FIG. 16

| Top Electrode | 50 |
| Non-Magnetic Metal Cap Layer | 40b |
| Free Layer | 21 |
| Oxide Layer (tunnel barrier) | 19 |
| Reference Layer | 12 |
| Oxide Layer | 15 | or 15 may be replaced by seed layer 2
| Substrate | 1 |

FIG. 17

55s — 55
| Oxide Cap Layer | 40a |
60s — | Free Layer (FL) | 20-1, 20-2, or 20-3 |
| Oxide Tunnel Barrier | 19 | } 60
| Reference Layer (RL) | 11 |
| Seed Layer | 15 |
| Substrate/Bottom Electrode | 1 |

FIG. 18

PERPENDICULARLY MAGNETIZED FERROMAGNETIC LAYERS HAVING AN OXIDE INTERFACE ALLOWING FOR IMPROVED CONTROL OF OXIDATION

PRIORITY DATA

The present application is a divisional application of, and claims the benefit of, U.S. Non-Provisional application Ser. No. 15/196,807, entitled "Perpendicularly Magnetized Ferromagnetic Layers Having an Oxide Interface Allowing for Improved Control of Oxidation," filed Jun. 29, 2016, which application is herein incorporated by reference in its entirety.

RELATED PATENT APPLICATIONS

This application is related to the following: U.S. Pat. No. 8,592,927; and filing date Nov. 23, 2015, Ser. No. 14/949,232, issued as U.S. Pat. No. 9,780,299, both assigned to a common assignee and herein incorporated by reference in their entirety.

TECHNICAL FIELD

The invention relates to a composite magnetic structure having a combination (stack) of oxide layers, ferromagnetic layers, and non-magnetic layers that improve the perpendicular magnetization used in magnetic thin films such that thermal stability is improved independent of the moment, volume, or crystalline anisotropy for a device with perpendicular magnetic anisotropy.

BACKGROUND

Magnetic thin films magnetized perpendicular to the plane of the film have many applications for memory and data storage technologies, e.g. magnetic hard disk drives, Magnetic Random Access Memories (MRAM) or magnetic domain wall devices.

Perpendicular magnetization relies on Perpendicular Magnetic Anisotropy (PMA), to overcome the magnetostatic shape anisotropy, the favored in-plane magnetization in thin film geometry.

Several physical phenomena can induce PMA, e.g. crystalline anisotropy, surface or interface anisotropy, and magnetoelastic anisotropy. Interfacial anisotropy occurs at an interface between an Oxide Layer (OL) (e.g. MgO) and a Ferromagnetic Layer (FML) (e.g. Fe, Co, CoFe or CoFeB), and is of particular technological importance. Indeed, this interface structure is widely used in MRAM devices, whose memory elements are based on magnetic tunnel junctions, each having two magnetic electrodes magnetized perpendicular to the plane of the Silicon wafer and separated by an oxide tunnel barrier.

In addition to the cited oxide and ferromagnetic layers, the magnetic tunnel junction (MTJ) structure can include a non-ferromagnetic metallic (ML), or seed layers, in a stacked structure. The simplest layered stack to create Perpendicular Magnetic Anisotropy (PMA) in one of the two magnetic electrodes of a Magnetic Tunnel Junction is to form a single ferromagnetic layer over a metallic layer, and then deposit an oxide layer over the ferromagnetic layer to give a stack designated from bottom to top ML/FML/OL, or in reverse order, OL/FML/ML.

Standard processes used in the semiconductor industry require heating wafers up to elevated temperatures as high at 400° C. for extended periods of time as long as several hours in an annealing process. Therefore MTJ devices constructed through semiconductor processes must withstand the temperature and time used in these standard processes without any degradation in magnetic and/or magneto-transport properties.

The Boltzmann Factor is the probability (p) in equation (1), that a thermal fluctuation causes a memory bit in an MTJ to flip between two stable states corresponding to a logical "0" and "1". The thermal stability is related to the energy barrier between the two states (E), Boltzmann's constant ($k_B$), and the absolute temperature (T) in equation (2).

$$\text{Boltzmann Factor} = p(E) = e^{-\Delta} \qquad (1)$$

$$\text{Thermal Stability factor} = \Delta = E/k_B T \qquad (2)$$

In the case of PMA, the energy barrier E depends on the magnetic anisotropy of the storage (i.e. free) layer. For a uniform magnetization reversal mechanism, the energy barrier E is proportional to the product of $K_{eff} \cdot t_{FML}$ where $t_{FML}$ is the thickness of the ferromagnetic layer. $K_{eff}$ is the effective anisotropy constant (having the dimension of an energy per unit volume).

$K_{eff}$ can be modeled as the sum of the interfacial anisotropy and shape anisotropy.

$$K_{eff} = \text{Interfacial Anisotropy} + \text{Shape Anisotropy} \qquad (3)$$

Interfacial anisotropy is inherent in the material properties and is represented by a constant $K_i$ (energy per unit surface) divided by the ferromagnetic layer film thickness. The shape anisotropy reduces the thermal stability and is modeled by equation (4), $$\text{Shape Anisotropy} = -2\pi M_s^2 \qquad (4)$$

where $M_s$ is the saturation magnetization, and $t_{FML}$ is the ferromagnetic layer film thickness. Interfacial Anisotropy causes PMA and the shape anisotropy reduces the PMA. In summary . . .

$$K_{eff} = K_i/t_{FML} - 2\pi M_s^2 \qquad (5)$$

Therefore from equation 5 the thermal stability should improve as the ferromagnetic layer $t_{FML}$ gets thinner. However, this model does not apply when $t_{FML}$ gets below a critical thickness. Experimentation finds that below the critical thickness, the ferromagnetic layer loses its magnetization due to imperfections and inter-diffusion with neighboring non-magnetic elements. Therefore the thermal stability reaches its maximum at the critical ferromagnetic thickness in a simple ML/FML/OL stack.

The simple PMA stack only provides weak PMA since there is a single OL/FML interface. The interfacial anisotropy ($K_i$) is not strong enough to sustain PMA for ferromagnetic layers thicker than ~15 Angstroms. Moreover, there is significant inter-diffusion between the ferromagnetic layer and the base metallic layer that is tantalum for example. Inter-diffusion can cause the interface between the ferromagnetic and metallic layers to be a magnetically "dead" layer. As a result, the magnetic properties of the ferromagnetic layer are found to degrade when $t_{FML} < \sim 8$ Angstroms. For this simple stack interface structure, the thermal stability at the critical ferromagnetic thickness is only ~0.2 erg/cm² and too small for practical applications.

An improved interface structure can be created by two OL/FML interfaces, layered in the form OL/FML/OL. This leads to higher PMA and enables the use of a thicker ferromagnetic layer. However, it is difficult to fabricate using oxidation to form the second oxide layer without also oxidizing the ferromagnetic layer. This leads to thick magnetically dead layers, loss of magnetization, and an increase of the resistance-area product of the Magnetic Tunnel Junction (MTJ).

Thus, an improved MTJ is needed with two oxide/FML interfaces to provide high PMA in the reference and free layers. Furthermore, oxidation to form the upper (second) OL must be better controlled to prevent undesirable oxidation of the FML and loss of PMA.

SUMMARY

The objective of the present disclosure is to provide a stronger Magnetic Tunnel Junction by strengthening the characteristics of the Perpendicular Magnetic Anisotropy in the stack structure.

A second objective of the present disclosure is to provide a method of forming the MTJ of the first objective.

According to one embodiment, the MTJ has a FML formed between two oxide layers in a $OL_1/FML/OL_2$ scheme where FML has two sub-layers ($FML_1$, $FML_2$) in a $FML_1/NML/FML_2$ configuration where NML is a non-magnetic layer, and FML may be either a free layer or reference layer.

There are three ways the present disclosure improves the Magnetic Tunnel Junction and thermal stability over the prior art. First, the resputtering of the NML having a relatively high re-sputtering rate during the deposition of $FML_2$ leads to a smoother ferromagnetic layer. A similar concept was disclosed in related patent application Ser. No. 14/949,232 with regard to depositing a second seed layer with a low resputtering rate over a first seed layer having a high resputtering rate.

Secondly, the presence of an NML inhibits the crystallization of the $FML_2$. As a result, the $FML_2$ has smaller grains and thinner grain boundaries. This reduces the diffusion of oxygen from the top oxide layer $OL_2$ to the $FML_2$ layer below it.

Lastly, the NML is a more highly reactive material than the $FML_1$ and $FML_2$ sub-layers. Therefore it attracts oxygen that has diffused from the $OL_2$ into the $FML_2$.

Another embodiment contains a ferromagnetic layer comprised of three FML sub-layers and two NMLs in an alternating scheme (from bottom to top or vice versa) $OL/FML_1/NML/FML_2/NML/FML_3/OL$.

A third embodiment is a ferromagnetic layer comprised of a multiplicity of alternating "n+1" FML sub-layers and "n" NML layers. From bottom to top or vice versa, this stack is of the form $OL/FML_1/NML_1/\ldots/FML_n/NML_n/FML_{n+1}/OL$. In a variation of the first, second, and third embodiments, the OL layers at the top or bottom of the stack may be replaced by an ML layer such as Tantalum, Tungsten, Molybdenum, Ruthenium, or Nickel-Chromium alloy. The ML/FML layer has an interfacial perpendicular magnetic anisotropy PMA.

BRIEF DESCRIPTION OF THE DRAWINGS

FIG. 1 is a notional view of the prior art for a Magnetic Tunnel Junction having a bottom spin valve configuration that is utilized in an MRAM, spin transfer oscillator (STO), or read/write head.

FIG. 2 is an MTJ in a prior art top spin valve configuration with the reference layer above the tunnel barrier and functionally equivalent to FIG. 1.

FIG. 3a is cross-sectional view of a free layer formed between a tunnel barrier and an oxide capping layer in a MTJ with a bottom spin valve configuration wherein the free layer is a laminate comprised of a non-magnetic layer (NML) formed between two ferromagnetic layers (FMLs) according to an embodiment of the present disclosure.

FIG. 6 and FIG. 9 are cross-sectional views of a MTJ with a bottom spin valve and top spin valve configuration, respectively, wherein a free layer having a laminated stack of NMLs and FML sub-layers is formed between two oxide layers according to an embodiment of the present disclosure.

FIGS. 7-8 are cross-sectional views of a MTJ with a bottom spin valve and top spin valve configuration, respectively, wherein the free layer has a laminated stack of NMLs and FML sub-layers formed between an oxide layer and a non-magnetic layer according to an embodiment of the present disclosure.

FIG. 10 and FIG. 13 are cross-sectional views of a MTJ with a top spin valve and bottom spin valve configuration, respectively, wherein a reference layer having a laminated stack of NMLs and FML sub-layers is formed between two oxide layers according to an embodiment of the present disclosure.

FIGS. 11-12 are cross-sectional views of a MTJ with a top spin valve and bottom spin valve configuration, respectively, wherein the reference layer has a laminated stack of NMLs and FML sub-layers formed between an oxide layer and a non-magnetic layer according to an embodiment of the present disclosure.

FIGS. 14-15 are cross-sectional views of a MTJ with a bottom spin valve and top spin valve configuration, respectively, wherein the free layer is doped with a non-magnetic material.

FIGS. 16-17 are cross-sectional views of a MTJ with a top spin valve and bottom spin valve configuration, respectively, wherein the reference layer is doped with a non-magnetic material.

FIGS. 18-20 show a sequence of process steps during the fabrication of a MTJ with a free layer formed according to an embodiment of the present disclosure.

DETAILED DESCRIPTION

Figure 3B:
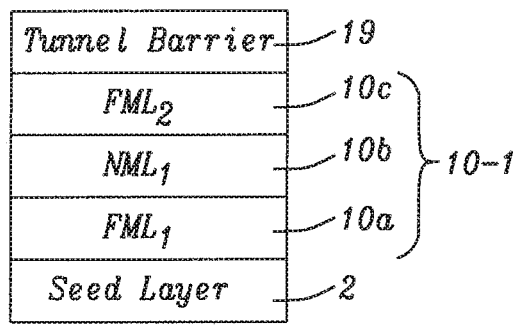
FIG. 3b is a cross-sectional view of a reference layer (RL) formed between a seed layer and a tunnel barrier in a MTJ with a bottom spin valve configuration wherein the RL is a laminate comprised of a non-magnetic layer (NML) formed between two ferromagnetic sub-layers ($FML_1$ and $FML_2$) according to an embodiment of the present disclosure.

The present disclosure is a MTJ wherein at least one of a free layer, reference layer, or dipole layer has perpendicular magnetic anisotropy that is maintained during 400° C. processing of the magnetic devices such as embedded MRAM and STT-MRAM, in spintronic devices such as microwave assisted magnetic recording (MAMR) and spin torque oscillators (STO), and in various spin valve designs including those found in read head sensors.

As disclosed in related U.S. Pat. No. 8,592,927, a MTJ may be comprised of a pinned layer, a tunnel barrier layer, and a magnetic element including a composite free layer having a magnetic saturation ($M_s$) reducing (moment diluting) layer formed between two magnetic sub-layers ($FM_1$ and $FM_2$). The $FM_1$ layer has a surface that forms a first interface with the tunnel barrier while the $FM_2$ layer has a surface facing away from the tunnel barrier that forms a second interface with a perpendicular Hk enhancing layer which is employed to increase the perpendicular anisotropy field within the $FM_2$ layer.

In related patent application Ser. No. 14/949,232, we disclosed an improved seed layer stack wherein a low resputtering rate layer with amorphous character such as CoFeB is deposited on a high resputtering rate layer that is Mg, for example, to provide a "smoothing effect" to reduce peak to peak roughness at a top surface of the uppermost NiCr seed layer in a Mg/CoFeB/NiCr configuration. Thus, the NiCr seed layer has a smooth top surface with a peak to peak thickness variation of about 0.5 nm over a range of 100 nm compared with a peak to peak variation of about 2 nm over a range of 100 nm in prior art seed layer films as determined by transmission electron microscope (TEM) measurements.

We have discovered that the MTJ structures disclosed in the aforementioned related applications may be further improved according to the embodiments described herein. The MTJ in the present disclosure is comprised of a stack structure with improved control of the oxidization of an oxide layer above the free layer or a reference layer. The free layer or reference layer consists of a multiplicity (n) of thin ferromagnetic layers (Fe, Co, CoFe, CoFeB or combination thereof) deposited in an alternating sequence with (n−1) NMLs having a high resputtering rate and low magnetic dilution effect. According to one embodiment, the MTJ has a FML formed between two oxide layers in a $OL_1$/FML/$OL_2$ scheme where FML has a $FML_1$/NML/$FML_2$ configuration. The role of the NMLs is threefold and thereby provides three advantages in performance compared with the prior art Magnetic Tunnel Junctions in FIG. 1 and FIG. 2.

First, the resputtering of the NML having a relatively high resputtering rate during the deposition of $FML_2$ in a $FML_1$/NML/$FML_2$ configuration leads to a smoother $FML_2$ ferromagnetic layer. In other embodiments, where a $FML_n$ layer is deposited on a $NML_{n-1}$ layer, a similar smoothing effect is realized for the top surface of the $FML_n$ layer.

Secondly, the presence of an NML layer inhibits the crystallization of the $FML_2$ layer, or in more general terms, a $NML_{n-1}$ layer inhibits crystallization in the overlying $FML_n$ layer. As a result, the $FML_2$ layer (and $FML_n$ layer) has smaller grains and thinner grain boundaries. This reduces the diffusion of oxygen from the top oxide layer $OL_2$ to the $FML_2$ layer below it.

Lastly, the NML is a more highly reactive material than the FML sub-layers. Therefore it attracts oxygen that has diffused from the $OL_2$ into the $FML_2$. As a result, the FML ferromagnetic sub-layers, and especially the upper $FML_n$ sub-layer in a stack with "n" FML sub-layers and "n−1" NML layers, are less oxidized than in the prior art which leads to a better magnetoresistive ratio and greater FML thermal stability.

According to one embodiment of the present disclosure shown in FIG. 3a, the free layer 20-1 has a $FML_1$/$NML_1$/$FML_2$ configuration in which $FML_1$ 20a made from Fe, Co, Ni, CoFe, CoB, FeB, CoFeB, CoFeNiB, or combination thereof, is deposited on the oxide tunnel barrier layer hereafter called the tunnel barrier 19. The tunnel barrier is a metal oxide or oxynitride comprised of one or more oxide or oxynitride layers made from one or more of Si, Ba, Ca, La, Mn, V, Al, Ti, Zn, Hf, Mg, Ta, B, Cu, Cr. $NML_1$ 20b with a thickness from 0.5 to 10 Angstroms is then deposited over the first $FML_1$ 20a. The $NML_1$ is a highly reactive metal with a relatively high re-sputtering rate and is typically a metal such as Mg, Al, B, Ca, Ba, Sr, Si, or C. Next a second $FML_2$ 20c is deposited over the $NML_1$ 20b and is selected from one of Fe, Co, Ni, CoFe, CoB, FeB, CoFeB, CoFeNiB, or a combination thereof.

The deposition of $FML_2$, which has a low resputtering rate compared with $NML_1$, resputters a portion of $NML_1$, which leads to a smoother top surface for both of $NML_1$ and $FML_2$. As described in related application Ser. No. 14/949,232, a high resputtering rate for material A vs. material B results from one or both of a higher bond energy and a higher atomic number for material B.

The presence of $NML_1$ prior to the deposition of $FML_2$ inhibits the crystallization of $FML_2$. As a result, $FML_2$ 20c has smaller grains and thinner grain boundaries. This reduces the diffusion of oxygen from the subsequently deposited capping oxide layer 40 to the $FML_2$ layer below it. Furthermore, $NML_1$ 20b is a more highly reactive material than the $FML_2$ layer. As a result, $NML_1$ 20b attracts oxygen that has diffused from the top oxide layer 40 into the $FML_2$ and thereby prevents oxidation of the $FML_2$.

Referring to FIG. 3b, an alternative embodiment of the present disclosure is depicted wherein a reference layer 10-1 having a $FML_1$/$NML_1$/$FML_2$ configuration is formed between a seed layer 2 and tunnel barrier 19. The seed layer may be comprised of one or more metals or alloys such as those disclosed in related patent application Ser. No. 14/949,232, or other materials used in the art.

The composition of the $FML_1$, $NML_1$, and $FML_2$ layers was described previously. In this case, the $NML_1$ layer serves to prevent oxidation of the $FML_2$ layer by attracting oxygen that diffuses into $FML_2$ from the tunnel barrier. Otherwise, all of the benefits associated previously described with forming a $FML_1$/$NML_1$/$FML_2$ stack apply to the reference layer 10-1.

Figure 4A:
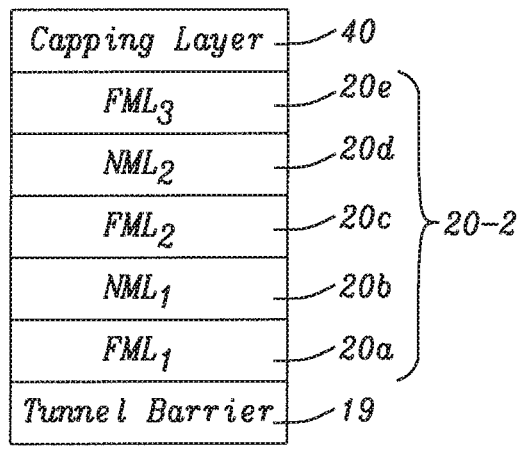
FIGS. 4a and 5a represent modifications of the FIG. 3a embodiment wherein the free layer has a plurality of "n" non-magnetic layers (NMLs) in the laminated stack of NMLs and "n+1" FML sub-layers.

According to another embodiment shown in FIG. 4a, the free layer laminated stack 20-1 described earlier is modified to form free layer 20-2 by sequentially depositing a $NML_2$ layer 20d and $FML_3$ layer 20e on the $FML_2$ layer to give a $FML_1$/$NML_1$/$FML_2$/$NML_2$/$FML_3$ configuration. $NML_2$ is selected from one of Mg, Al, B, Ca, Ba, Sr, Si or C, and $FML_3$ is made of one or more of Fe, Co, Ni, CoFe, CoFeB, CoB, FeB, and CoFeNiB. Capping layer 40 contacts a top surface of $FML_3$ 20e. When the capping layer is an oxide, an oxide/$FML_3$ interface induces or enhances PMA in the $FML_3$ layer.

Figure 4B:
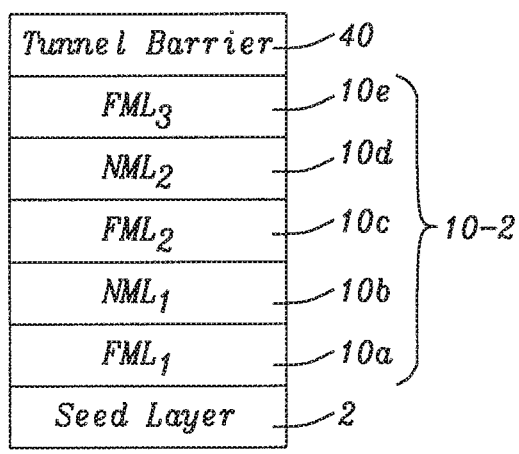
FIGS. 4b and 5b represent modifications of the FIG. 3b embodiment wherein the reference layer has a plurality of "n" NMLs in the laminated stack of NMLs and "n+1" FML sub-layers.

In FIG. 4b, the reference layer stack 10-2 in FIG. 3b may be enhanced to form an alternative embodiment where a $FML_1/NML_1/FML_2/NML_2/FML_3$ stack is formed between seed layer 2 and tunnel barrier 19. In other words, additional layers $NML_2$ and $FML_3$ are sequentially deposited on $FML_2$ to give a reference layer having the same advantages as reference layer stack 10-1. Again, the presence of an oxide tunnel barrier 19 adjoining a top surface of the upper FML layer induces or creates PMA in the upper FML ($FML_3$) layer.

Figures 5A, 5B:
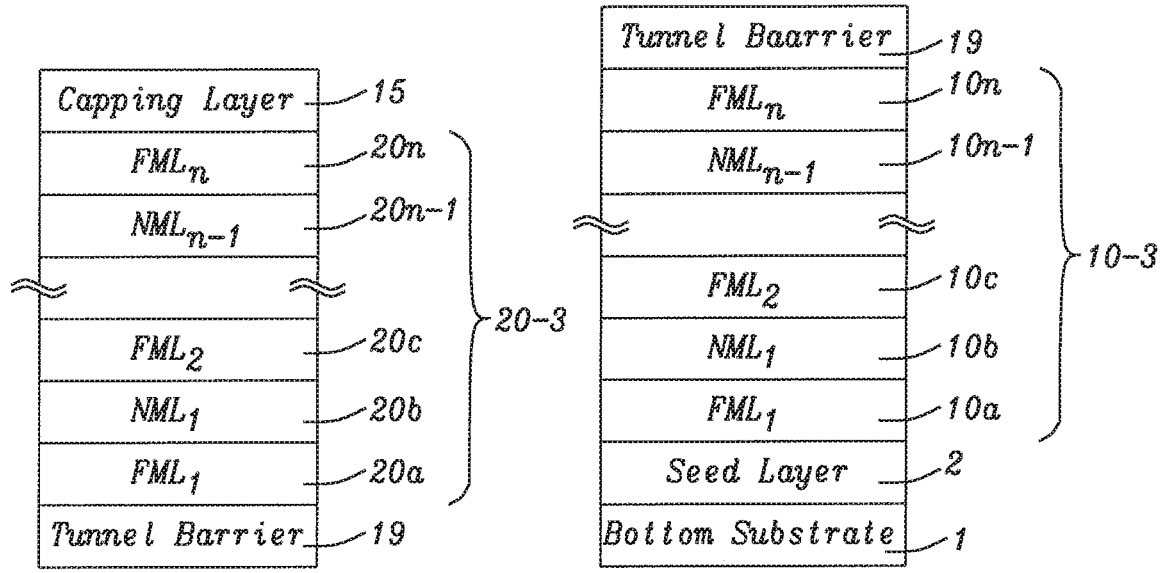

In FIG. 5a, another embodiment of the present disclosure is depicted wherein the free layer laminated stack 20-1 described earlier is modified to form free layer stack 20-3 by depositing a plurality of "n−1" NML layers 20b, 20n-1, and "n" FML sub-layers 20a, 20c, 20n in alternating fashion on the tunnel barrier 19 to give a $FML_1/NML_1 \ldots FML_{n-1}/NML_{n-1}/FML_n$ configuration. Each NML is selected from one of Mg, Al, B, Ca, Ba, Sr, Si, or C, and each FML sub-layer is made of one or more of Fe, Co, Ni, CoFe, CoFeB, CoB, FeB, and CoFeNiB. Capping layer 40 contacts a top surface of $FML_n$ 20n and may enhance PMA therein by forming an oxide layer/$FML_n$ interface.

In FIG. 5b, the reference layer stack 10-1 in FIG. 3b may be enhanced to form an alternative embodiment to form reference layer stack 10-3 wherein a plurality of "n−1" NML layers and "n" FML sub-layers are deposited on seed layer 2 in alternating fashion to give a $FML_1/NML_1 \ldots FML_{n-1}/NML_{n-1}/FML_n$ configuration. Each NML is selected from one of Mg, Al, B, Ca, Ba, Sr, Si or C, and each FML sub-layer is made of one or more of Fe, Co, CoFe, CoB, FeB, CoFeB, and CoFeNiB. Tunnel barrier 19 contacts a top surface of $FML_n$ 20n and enhances or induces PMA therein by forming an oxide layer/$FML_n$ interface. Thus, the process of depositing a FML sub-layer on a NML is repeated a plurality of times to reduce crystallization in each successive NML, provide a smoothing effect on a top surface of each FML sub-layer, and prevent oxidation of the $FML_n$ by reacting with oxygen that may diffuse from the tunnel barrier into the $FML_n$.

In all of the aforementioned embodiments, the present disclosure anticipates where one or more of the $FML_n$ sub-layers may be comprised of a laminated stack such as $(Co/X)_m$ or $(X/Co)_m$ where m is from 1 to 30, and X is Pt, Pd, Ni, NiCo, Ni/Pt, or NiFe. In another aspect, CoFe or CoFeR may replace Co in the laminated stack where R is one of Mo, Mg, Ta, W, or Cr.

Figure 6:
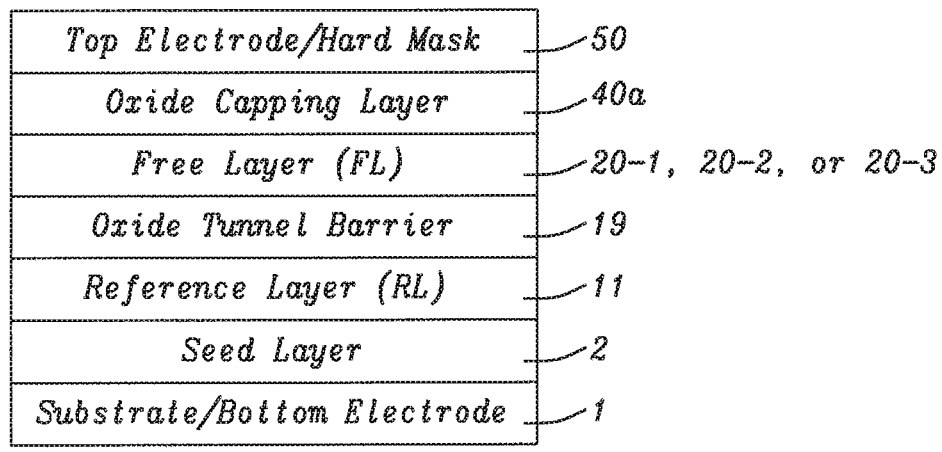

Referring to FIG. 6, the present disclosure also encompasses an embodiment wherein a MTJ encompasses a free layer stack 20-1, 20-2, or 20-3 formed between two oxide layers. In the exemplary embodiment, the free layer contacts a top surface of the tunnel barrier 19, and adjoins a bottom surface of an oxide capping layer 40a. The oxide capping layer may be comprised of one or more oxide layers that are selected from the materials previously described with respect to tunnel barrier 19. In a bottom spin valve configuration, seed layer 2, reference layer 11, the tunnel barrier, the free layer, and capping layer 40a are sequentially formed on a substrate 1 that may be a bottom electrode in a MRAM, a bottom shield in a read head sensor, or a main pole layer in a STO device. The reference layer may be a synthetic antiparallel (SyAP) configuration wherein an antiferromagnetic coupling layer such as Ru is formed between a lower AP2 ferromagnetic layer contacting the seed layer and an upper AP1 ferromagnetic layer (not shown) contacting the tunnel barrier. One or both of the AP2 and AP1 layers may be one or more of Co, Fe, Ni, CoB, FeB, CoFe, CoFeB, or CoFeNiB, or a laminate such as $(Co/X)_m$ or $(X/Co)_m$ described earlier. A top electrode 50 is formed on the capping layer and there may be an optional hard mask (not shown) such as MnPt between the capping layer and top electrode. In other embodiments, the top electrode is a top shield in a read head sensor or a trailing shield in a STO device.

Referring to FIG. 7, an alternative bottom spin valve MTJ is shown wherein all of the layers are retained from FIG. 6 except the oxide capping layer is replaced by a non-magnetic capping layer 40b. In some embodiments, capping layer 40b is one or more of Ru, W, Mo, NiCr, and Ta, including Ru/Ta and Ru/Ta/Ru configurations.

In FIG. 8, a MTJ with a top spin valve configuration is shown according to an embodiment of the present disclosure. All layers are retained from FIG. 7 except the positions of the free layer 20-1 (or 20-2 or 20-3) and reference layer 11 are switched so that the seed layer 2, free layer, tunnel barrier 19, reference layer, and capping layer 40b are sequentially formed on substrate 1. The seed layer may be one or more of W, Ru, Ta, Mo, and NiCr.

In FIG. 9, another top spin valve configuration of the present disclosure is depicted that represents a modification of FIG. 6 where the free layer 20-1 (or 20-2 or 20-3), tunnel barrier 19, reference layer 11, and capping layer 40b are sequentially formed on an oxide layer 15 above an optional seed layer 2 on substrate 1. Oxide layer 15 may be selected from one of the oxide materials previously mentioned with regard to oxide capping layer 40a. As a result, there are two oxide layer/free layer interfaces at free layer top and bottom surfaces with tunnel barrier and oxide layer, respectively, to enhance PMA within the free layer.

Referring to FIG. 10, the present disclosure also anticipates the reference layer 10-1 (or 10-2 or 10-3) may be formed between two oxide layers in a top spin valve MTJ. In the exemplary embodiment, seed layer 2, free layer 21, tunnel barrier 19, the reference layer, and oxide capping layer 40a are sequentially formed on substrate 1. Free layer 21 may be selected from the same materials as previously described with regard to reference layer 11. In this case, the reference layer has a first interface with the oxide tunnel barrier and a second interface with the oxide capping layer to enhance PMA in the reference layer.

In FIG. 11, another top spin valve MTJ is shown that retains all of the layers in FIG. 10 except the oxide cap layer is replaced with a non-magnetic capping layer 40b described previously.

Referring to FIG. 12, a bottom spin valve MTJ is shown that retains all of the layers in FIG. 11. However, the positions of the free layer 21 and reference layer 10-1 (or 10-2 or 10-3) are switched such that the reference layer, tunnel barrier 19, free layer, and capping layer 40b are sequentially formed on seed layer 2.

In FIG. 13, another bottom spin valve embodiment is illustrated that is a modification of the MTJ in FIG. 12 where seed layer 2 is replaced by an oxide layer 15 such that the reference layer has two oxide interfaces to enhance PMA therein.

According to another embodiment shown in FIG. 14, the non-magnetic material that attracts oxygen from a ferromagnetic layer (FML) may be embedded or doped within the FML 22 rather than forming a laminated stack of "n" FML sub-layers and "n−1" NMLs in earlier embodiments. Depending on the doped concentration in the FML, the non-magnetic material's efficiency in reacting with oxygen that may diffuse into the FML from an adjoining oxide layer may be less than in earlier embodiments involving the lamination of "n" FML sub-layers and "n−1" NMLs.

Moreover, the advantage of inhibiting crystallization in the FML may also be reduced compared with previous embodiments. Since a low resputtering rate material is not deposited on a high resputtering rate material in this embodiment, the smoothing effect of depositing a FML on a NML described earlier does not apply here.

Free layer 22 is doped or embedded with one or more of Mg, Al, Si, Ca, Sr, Ba, C, or B where the non-magnetic material has a concentration from 0.1 to 30 atomic % in the free layer. The non-magnetic material may be embedded in the free layer by a co-deposition process. The non-magnetic material has a magnetic dilution effect, which means that as the concentration of the non-magnetic element is increased in the free layer, the magnetic moment of the free layer is reduced. In the exemplary embodiment, an optional seed layer 2, reference layer 11, tunnel barrier 19, the free layer, capping layer 40 are sequentially formed on the substrate 1. Note that capping layer may comprise one or more non-magnetic metals as in 40b or an oxide material as in 40a.

In FIG. 15, the present disclosure also encompasses a top spin valve embodiment where oxide layer 15, free layer 22, tunnel barrier 19, reference layer 11, and capping layer 40b are sequentially formed on substrate 1.

FIG. 16 represents a modification of the top spin valve MTJ in FIG. 15 wherein doped free layer 22 is replaced by free layer 21 described earlier while a reference layer 12 is employed that is doped with one or more of Mg, Al, Si, Ca, Sr, C, Ba or B. Thus, the MTJ stack has a seed layer/free layer/tunnel barrier/doped reference layer/capping layer configuration.

Referring to FIG. 17, a bottom spin valve MTJ is shown where oxide layer 15, doped reference layer 12, tunnel barrier 19, free layer 21, and cap layer 40 are sequentially formed on substrate 1.

The present disclosure also anticipates a method of forming a MTJ wherein a ferromagnetic layer comprises a laminated stack of FML sub-layers and NML layers as shown in FIGS. 3a-5b. In FIG. 18, an intermediate step is shown during the fabrication of MTJ 60 that is formed by sequentially forming a seed layer 2, reference layer 11, tunnel barrier 19, free layer 20-1 (or 20-2 or 20-3), and oxide capping layer 40a on substrate 1. After all of the layers in the MTJ are formed by a conventional method, a photoresist layer 55 is coated and patterned on a top surface of the cap layer 40a to form sidewall 55s which is transferred through MTJ 60 by a subsequent ion beam etch (IBE) to form sidewall 60s on the MTJ.

Figure 19:
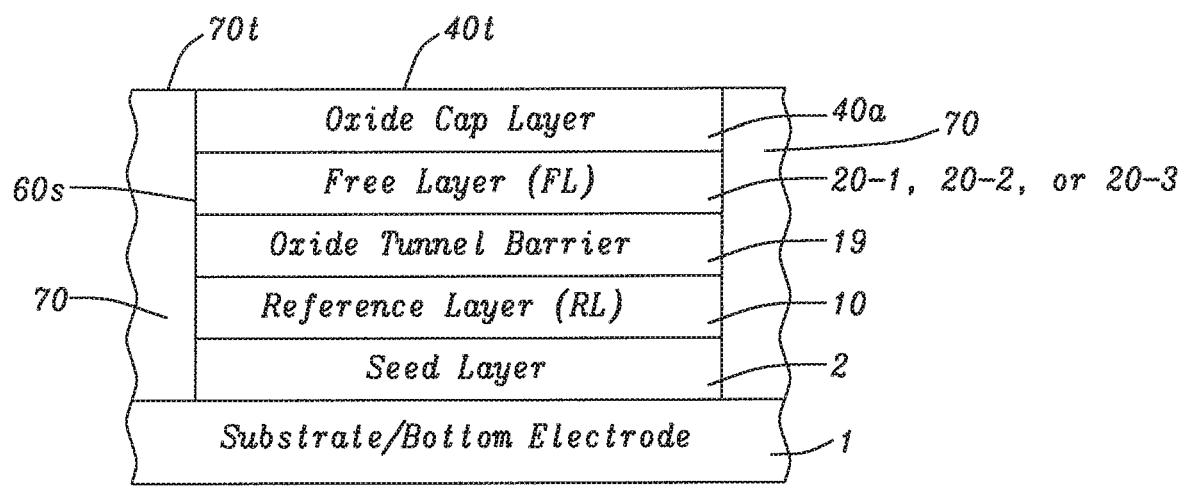

In FIG. 19, a dielectric layer 70 such as silicon oxide, silicon nitride or alumina is deposited to a level above the capping layer, and then a chemical mechanical polish (CMP) process is performed to remove the photoresist layer and form a top surface 70t that is coplanar with a top surface 40t of the capping layer 40a.

Figure 20:
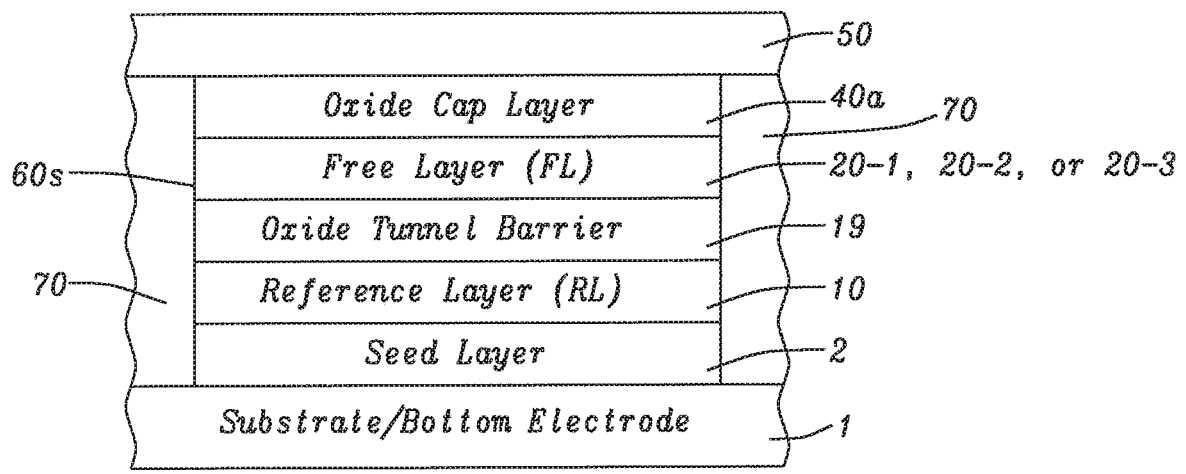

Thereafter, in FIG. 20, the top electrode 50 is formed on the dielectric layer 70 and capping layer 40a by a method well known to those skilled in the art.

Figure 21:
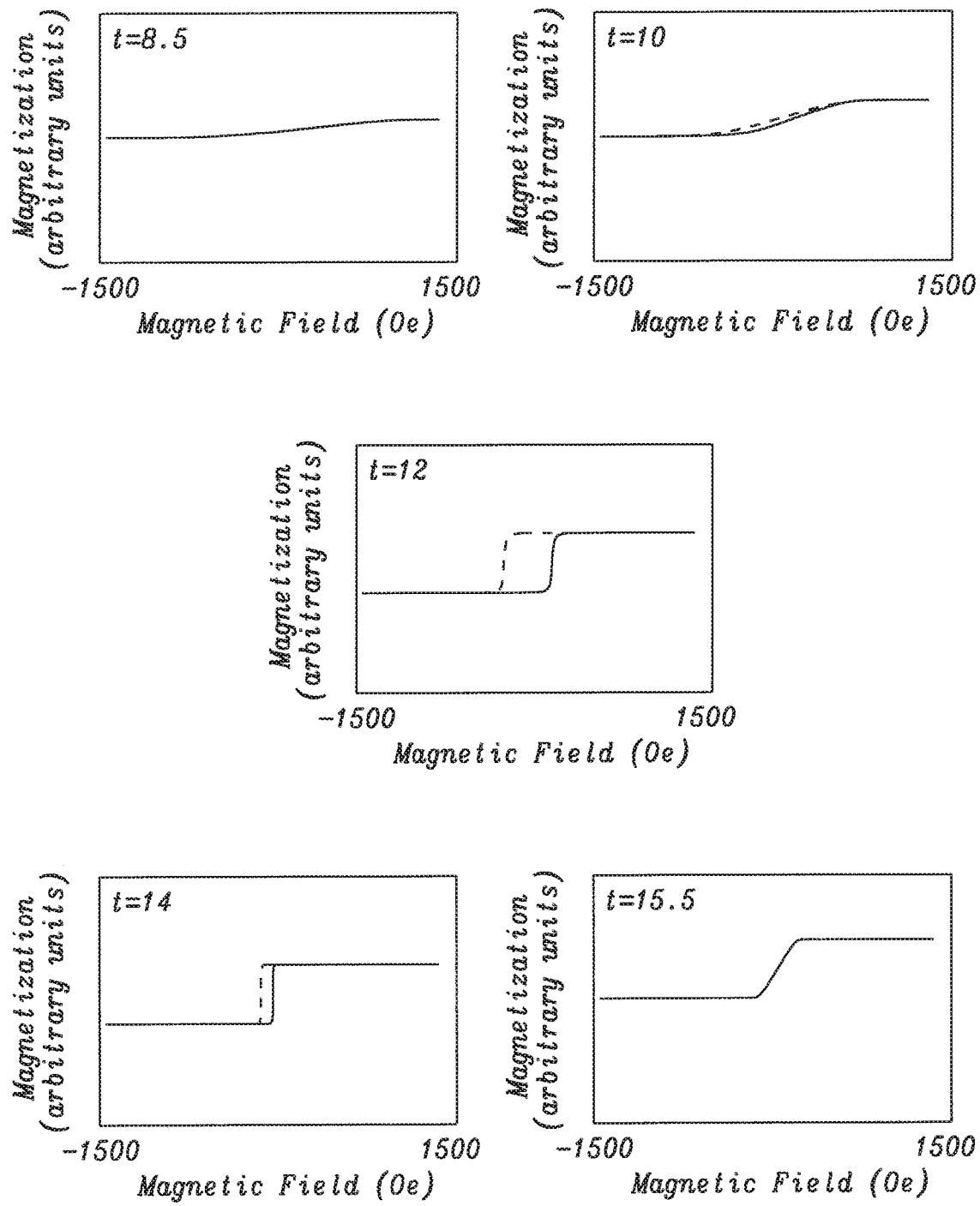
FIG. 21 shows a plot of the magnetization vs. magnetic field for various free layer thicknesses "t", in Angstroms, of the prior art OL/FML/OL stack structure from FIG. 1.
Figure 22:
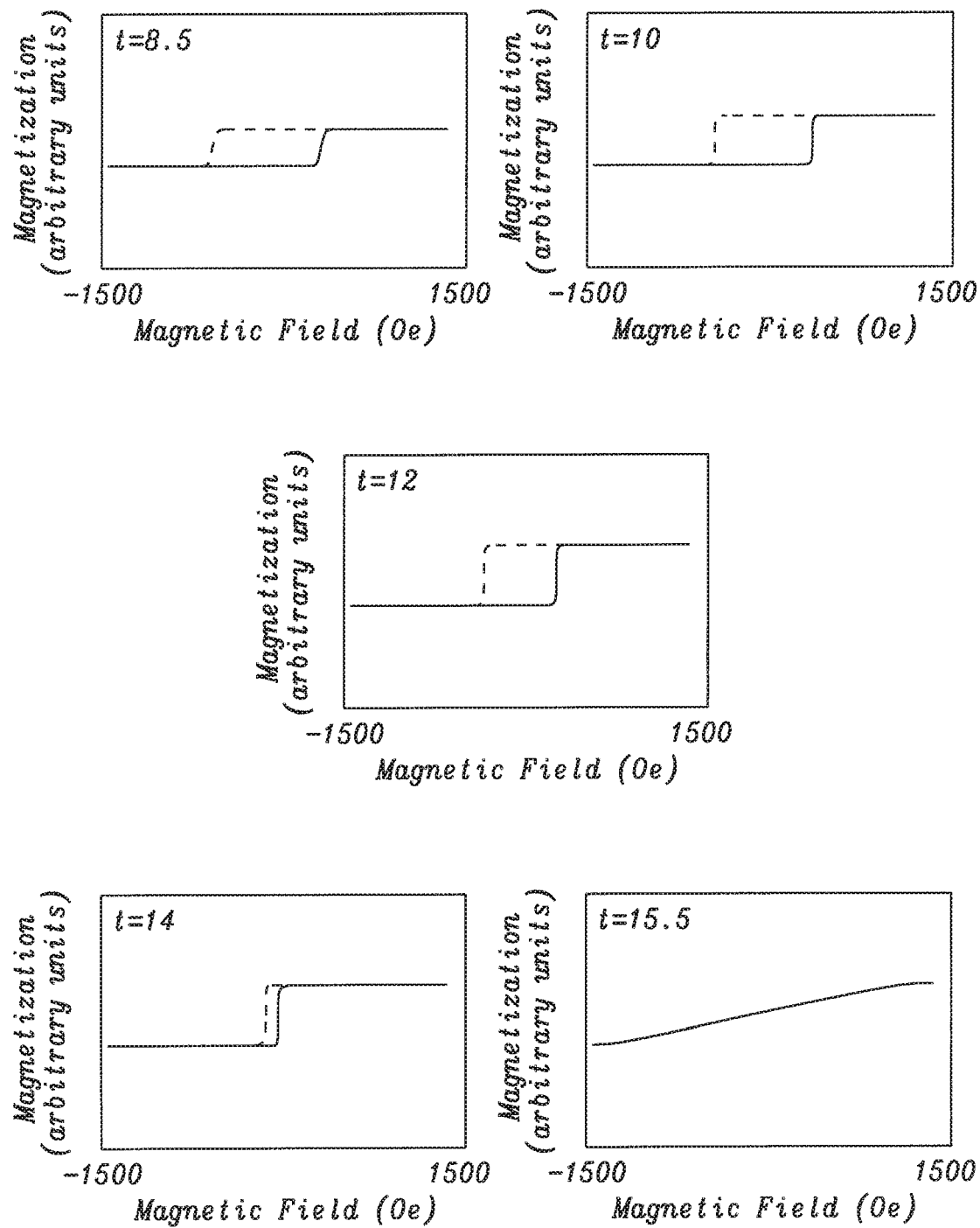
FIG. 22 shows a plot of magnetization vs. magnetic field for various free layer thicknesses "t", in Angstroms in a $OL/FML_1(t_1)/NML/FML_2(t_2)/OL$ stack formed according to an embodiment of the present disclosure where $t_1=t_2$, and $t=t_1+t_2$.
Figure 23:
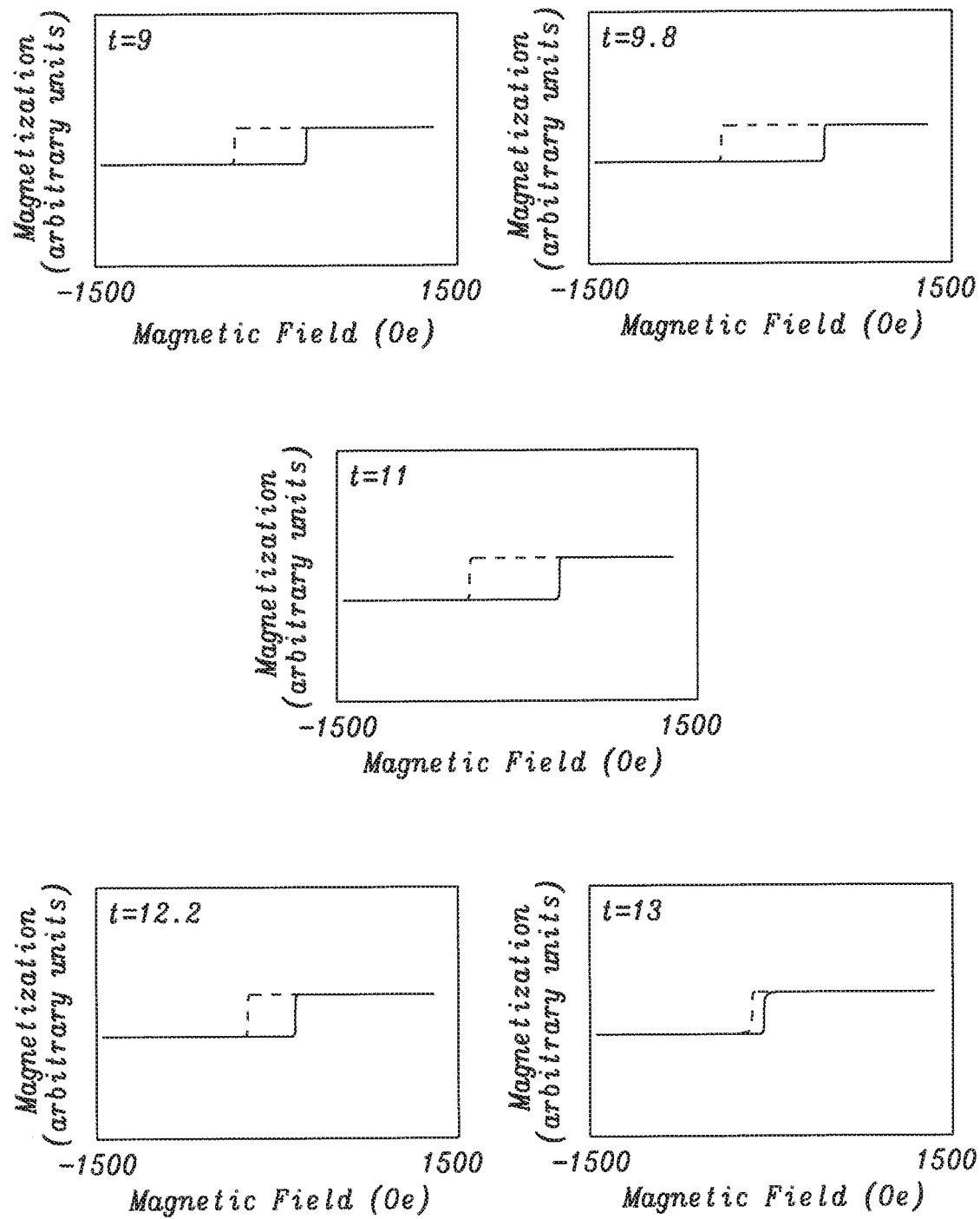
FIG. 23 shows a plot of magnetization vs. magnetic field for various free layer thicknesses "t", in Angstroms, in a $OL/FML_1$ (4 Angstroms)$/NML_1/FML_2(t1)/NML_2/FML_3$ $(t_2)/OL$ stack formed according to another embodiment of the present disclosure where $t_1/t_2=3/4$ and $t=(4+t_1+t_2)$ Angstroms.

FIGS. 21, 22, and 23 show the magnetic hysteresis loop for various stacks that have been annealed at 330° C. for thirty minutes using Kerr magnetometry. Magnetization is measured for fields between +1500 and −1500 Oe. Branches measured for increasing and decreasing fields are indicated as dashed and solid lines, respectively. The Kerr magnetization signal is proportional to the perpendicular magnetization. The thickness, t, is the total thickness of one or more FML. The figures of merit on these measurements are the squareness of the loops and the value of the coercive field.

The data shows the addition of one NML (FIG. 22) or two NML (FIG. 23) yields improved coercivity over a wider range in thicknesses. In particular, improved PMA is achieved down to layers thinner than 12 Angstroms. This is contrary to the prior art without NML shown in FIG. 21 for which the FML becomes discontinuous and loses its PMA below 12 Angstroms.

Figure 24:
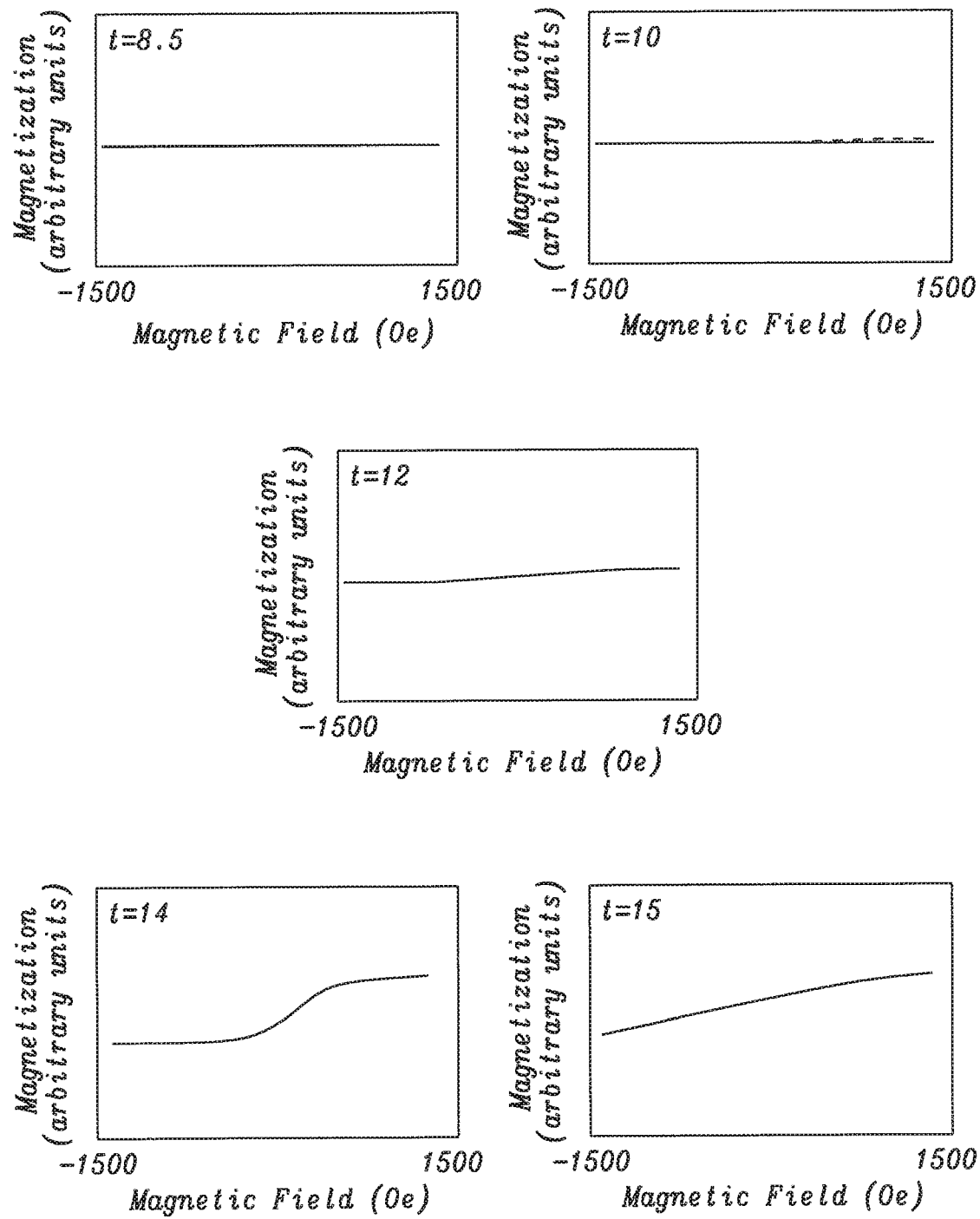
FIG. 24 shows a plot of the degraded magnetization vs. magnetic field for a free layer stack without an NML layer that has been annealed at 400° C. for five hours and illustrates that the range of FML thickness does not exhibit the square loop characteristic of PMA.
Figure 25:
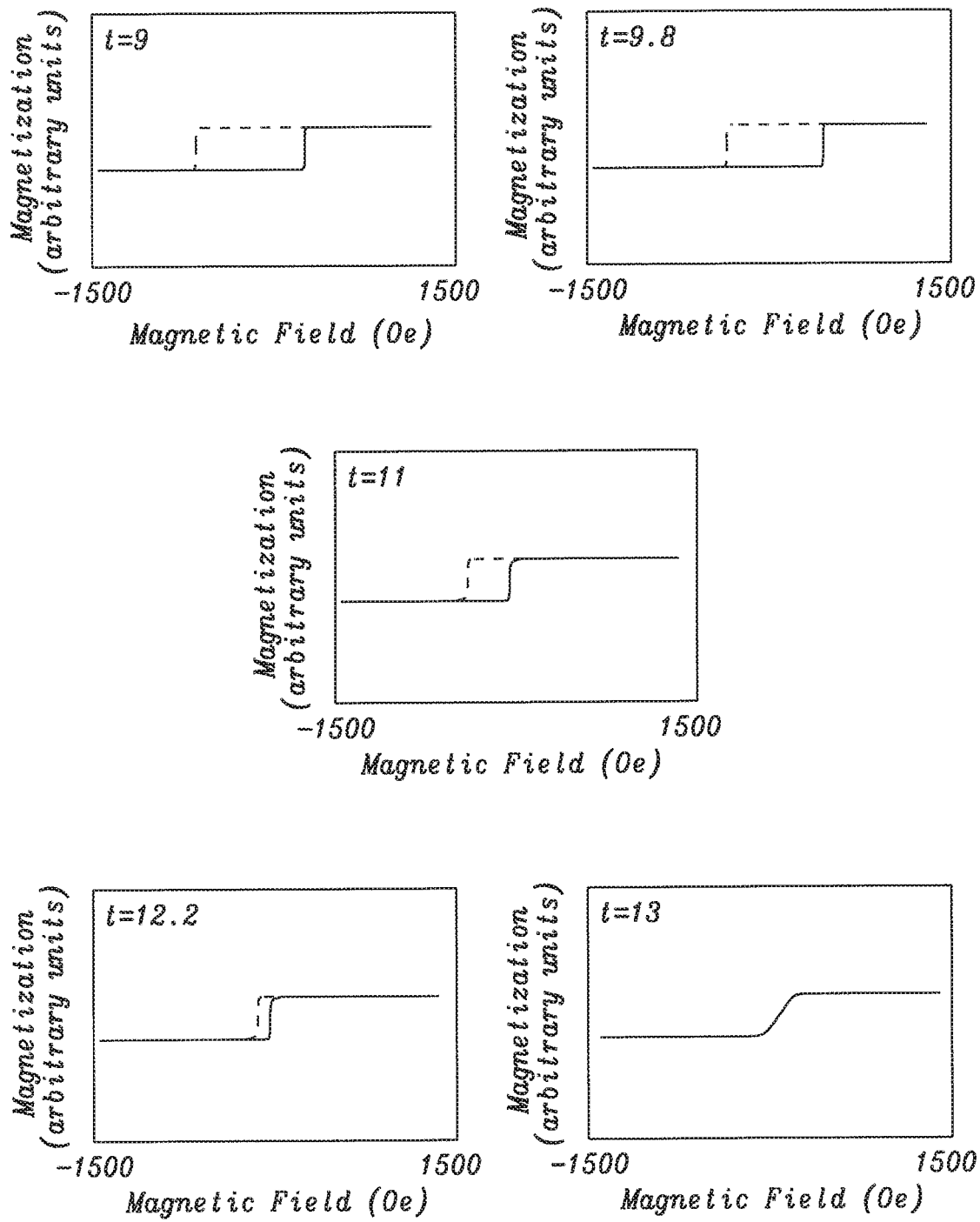
FIG. 25 shows a plot of the magnetization vs. magnetic field for a free layer stack with two NMLs that has been annealed at 400° C. for five hours.

Another benefit is improved thermal budget in a magnetic tunnel junction having a free layer formed according to an embodiment described herein. FIGS. 24-25 show magnetic hysteresis loops for a stack without NML and one with two NMLs. Both stacks were annealed at 400° C. for 5 hours. The magnetic properties of the stack without NML are strongly degraded, as indicated by the reduction of squareness and coercive field. The magnetic signal is strongly reduced and vanishes for layers thinner than 14 Angstroms. Thicker layer do not exhibit square loops characteristic of perpendicular magnetization. By contrast, the stack having 2 NMLs retains square loops and non-zero coercive fields. This indicates that the stack retains good PMA after 5 hour annealing at 400° C.

What is claimed is:

1. A method, comprising:
   forming a magnetic tunnel junction (MTJ) stack, wherein the forming the MTJ stack includes:
   forming a first electrode over a substrate;
   depositing a reference layer over the first electrode;
   depositing an oxide tunnel barrier layer interfacing the reference layer;
   forming a free layer stack (FL) adjacent the oxide tunnel barrier layer; and
   forming an oxide cap layer such that a first surface of the FL interfaces the oxide tunnel barrier layer and an opposing surface of the FL interfaces the oxide cap layer, wherein the forming of the FL includes:
   depositing a first ferromagnetic layer;
   depositing a first non-magnetic layer on the first ferromagnetic layer, the first non-magnetic layer having a first resputtering rate; and
   depositing a second ferromagnetic layer on the first non-magnetic layer, the second ferromagnetic layer having a second resputtering rate less than the first resputtering rate, wherein the depositing of the second ferromagnetic layer causes a resputtering of a portion of the first non-magnetic layer.

2. The method of claim 1, wherein the depositing the first non-magnetic layer deposits a layer of a material selected from the group consisting of Mg, Al, Si, Ca, C, Sr, Ba, B, and combinations thereof.

3. The method of claim 1, wherein a thickness of the first non-magnetic layer is in a range from about 0.5 Angstroms to about 10 Angstroms.

4. The method of claim 1, wherein the depositing the first non-magnetic layer deposits a layer of Sr, Ba or combinations thereof.

5. The method of claim 1, wherein the depositing the reference layer includes:
   depositing a third ferromagnetic layer over the substrate;
   depositing a second non-magnetic layer directly on the third ferromagnetic layer; and
   depositing a fourth ferromagnetic layer directly on the second non-magnetic layer.

6. The method of claim 5, wherein the oxide tunnel barrier layer is formed directly on the fourth ferromagnetic layer.

7. A method, comprising:

forming a reference layer of a magnetic tunnel junction (MTJ) stack over a substrate;

forming a tunnel barrier layer of the MTJ stack on the reference layer;

forming a free layer of the MTJ stack on the tunnel barrier layer, the forming of the free layer including:
- depositing a first ferromagnetic layer directly on the tunnel barrier layer;
- depositing a non-magnetic layer of a first reactive material, the first reactive material selected from the group consisting of Mg, Al, B, Ca, Ba, Sr, Si or C on the first ferromagnetic layer, the non-magnetic layer having a first resputtering rate; and
- depositing a second ferromagnetic layer on the non-magnetic layer, the second ferromagnetic layer having a second resputtering rate less than the first resputtering rate, wherein the depositing of the second ferromagnetic layer causes a resputtering of a portion of the non-magnetic layer; and forming a capping oxide layer of the MTJ stack directly on the second ferromagnetic layer, and diffusing oxygen from the capping oxide layer to the second ferromagnetic layer; and attracting the diffused oxygen in the second ferromagnetic layer to the first reactive material due to the first reactive material being more highly reactive to oxygen than a composition of the second ferromagnetic layer.

8. The method of claim 7, further comprising: inducing a perpendicular magnetic anisotropy in the free layer.

9. The method of claim 7, wherein the capping oxide layer includes an oxide of a material selected from the group consisting of Ru, W, Mo, NiCr, Ta, and combinations thereof.

10. The method of claim 7, wherein a thickness of the non-magnetic layer is in a range from about 0.5 Angstroms to about 10 Angstroms.

11. The method of claim 7, wherein the substrate includes a material selected from the group consisting of W, Ru, Ta, Mo, NiCr, and combinations thereof.

12. The method of claim 7, wherein each of the first ferromagnetic layer and the second ferromagnetic layer includes a material selected from the group consisting of Fe, Co, CoFe, CoB, FeB, CoFeB, CoFeNiB, and combinations thereof.

13. The method of claim 7, further comprising:
- patterning the MTJ stack using a patterned photoresist layer as an etch mask, the patterning forming a patterned MTJ stack;
- depositing a dielectric layer that physically contacts sidewalls and a top surface of the patterned MTJ stack; and
- performing a planarizing process such that a top surface of the dielectric layer is substantially aligned with the top surface of the patterned MTJ stack.

14. A method, comprising:

depositing a tunnel barrier layer on a reference layer;

forming a free layer, the free layer being of a magnetic tunnel junction (MTJ) stack, the free layer comprising:
- depositing of a first ferromagnetic layer of the free layer directly on the tunnel barrier layer;
- depositing a first non-magnetic layer of the free layer directly on the first ferromagnetic layer, the first non-magnetic layer having a first resputtering rate;
- depositing a second ferromagnetic layer of the free layer on the first non-magnetic layer, wherein the second ferromagnetic layer has a second resputtering rate less than the first resputtering rate;
- depositing a second non-magnetic layer of the free layer on the second ferromagnetic layer; and
- depositing a third ferromagnetic layer of the free layer directly on the second non-magnetic layer, wherein depositing the first non-magnetic layer and depositing the second non-magnetic layer deposit a layer of Mg, Al, B, Ca, Ba, Sr, Si, or C; and depositing a capping layer of the MTJ stack directly on a top surface of the third ferromagnetic layer of the free layer, wherein the reference layer, tunnel barrier layer, and free layer form a magnetic structure.

15. The method of claim 14, further comprising:
- forming a patterned photoresist layer on a top surface of the capping layer of the MTJ stack;
- patterning the magnetic structure using the patterned photoresist layer as an etch mask, the patterning forming a patterned magnetic structure;
- depositing a dielectric layer that adjoins sidewalls and a top surface of the patterned magnetic structure; and
- performing a planarizing process to remove the patterned photoresist layer, wherein the planarizing process causes a top surface of the dielectric layer to be substantially aligned with the top surface of the patterned magnetic structure.

16. The method of claim 15, wherein the dielectric layer includes a material selected from the group consisting of alumina, silicon dioxide, silicon nitride, and combinations thereof.

17. The method of claim 15, wherein the patterning of the magnetic structure includes ion beam etching, reactive ion etching, or a combination thereof.

18. The method of claim 14, wherein the capping layer of the MTJ stack includes a material selected from the group consisting of Si, Ba, Ca, La, Mn, V, Al, Ti, Zn, Hf, Mg, Ta, B, Cu, Cr, and combinations thereof.

19. The method of claim 14, wherein the first non-magnetic layer of the MTJ stack includes a material selected from the group consisting of Mg, Al, Si, Ca, C, Sr, Ba, B, and combinations thereof.

20. The method of claim 14, wherein depositing the second ferromagnetic layer is depositing the second ferromagnetic layer directly on the first non-magnetic layer; and wherein the depositing the second non-magnetic layer is depositing the second non-magnetic layer directly on the second ferromagnetic layer.

* * * * *